US012628362B2

(12) United States Patent
Gejo et al.

(10) Patent No.: US 12,628,362 B2
(45) Date of Patent: May 12, 2026

(54) INSULATED GATE BIPOLAR TRANSISTOR (IGBT) SEMICONDUCTOR DEVICE WITH REDUCED TURN-ON LOSS

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Ryohei Gejo, Kawasaki Kanagawa (JP); Tomoko Matsudai, Shibuya Tokyo (JP); Yoko Iwakaji, Meguro Tokyo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 691 days.

(21) Appl. No.: 17/856,236

(22) Filed: Jul. 1, 2022

(65) Prior Publication Data

US 2023/0268428 A1    Aug. 24, 2023

(30) Foreign Application Priority Data

Feb. 22, 2022    (JP) ................................. 2022-025268

(51) Int. Cl.
*H10D 12/00* (2025.01)
*H10D 62/10* (2025.01)

(52) U.S. Cl.
CPC ......... *H10D 12/411* (2025.01); *H10D 62/127* (2025.01)

(58) Field of Classification Search
CPC .. H10D 12/481; H10D 62/127; H10D 62/145; H10D 64/513; H10D 12/032–038; H10D 12/441–491; H10D 18/221
See application file for complete search history.

(56) References Cited

U.S. PATENT DOCUMENTS

| | | | |
|---|---|---|---|
| 10,811,524 | B2 | 10/2020 | Iwakaji et al. |
| 11,063,130 | B2 | 7/2021 | Iwakaji et al. |
| 2018/0301549 | A1 | 10/2018 | Takeuchi et al. |
| 2020/0091323 | A1 | 3/2020 | Iwakaji et al. |
| 2020/0303527 | A1 | 9/2020 | Matsudai et al. |

(Continued)

FOREIGN PATENT DOCUMENTS

| | | |
|---|---|---|
| JP | 2010206111 A | 9/2010 |
| JP | 6318061 B2 | 4/2018 |

(Continued)

OTHER PUBLICATIONS

Notice of Reasons for Refusal (Office Action) mailed Mar. 24, 2025 in corresponding Japanese Patent Application No. 2022-025268 with English machine translation, 10 pages.

*Primary Examiner* — William B Partridge
*Assistant Examiner* — Chevy J Boegel
(74) *Attorney, Agent, or Firm* — Kim & Stewart LLP

(57) ABSTRACT

S1≤S2<S3 being satisfied, where S1 is a surface area of the first gate electrode and the third semiconductor layer facing each other via the first insulating film, S2 is a surface area of the second gate electrode and the third semiconductor layer facing each other via the second insulating film, and S3 is a surface area of the third gate electrode and the third semiconductor layer facing each other via the third insulating film.

14 Claims, 6 Drawing Sheets

(56) References Cited

U.S. PATENT DOCUMENTS

| | | | |
|---|---|---|---|
| 2020/0312969 A1 | 10/2020 | Nagata | |
| 2021/0091072 A1 | 3/2021 | Matsudai et al. | |
| 2021/0134991 A1* | 5/2021 | Gejo ....................... | H02M 1/08 |
| 2021/0281258 A1 | 9/2021 | Sakano et al. | |
| 2021/0344341 A1 | 11/2021 | Okuda et al. | |
| 2021/0351285 A1* | 11/2021 | Matsudai ............. | H10D 12/481 |

FOREIGN PATENT DOCUMENTS

| | | | |
|---|---|---|---|
| JP | 6531026 | B2 | 6/2019 |
| JP | 2020-047789 | A | 3/2020 |
| JP | 2020-047790 | A | 3/2020 |
| JP | 2020-161786 | A | 10/2020 |
| JP | 2021-048337 | A | 3/2021 |
| JP | 2021-048338 | A | 3/2021 |
| JP | 2021-141304 | A | 9/2021 |

* cited by examiner

INSULATED GATE BIPOLAR TRANSISTOR (IGBT) SEMICONDUCTOR DEVICE WITH REDUCED TURN-ON LOSS

CROSS-REFERENCE TO RELATED APPLICATION

This application is based upon and claims the benefit of priority from Japanese Patent Application No. 2022-025268, filed on Feb. 22, 2022; the entire contents of which are incorporated herein by reference.

FIELD

Embodiments described herein relate generally to a semiconductor device.

BACKGROUND

IGBTs (Insulated Gate Bipolar Transistors) are widely used as power semiconductor elements that control high breakdown voltages and large currents. It is desirable for an IGBT that is used as a switching element to have a low on-voltage and low switching losses at turn-on and turn-off. Techniques that lower the turn-off loss while maintaining a low on-voltage include a double-gate structure in which two separate gate electrodes are formed, and one of the gate electrodes is switched off first. However, it is difficult to reduce the turn-on loss because the short-circuit withstand capacity is undesirably reduced when the channel density is increased. Therefore, as described in Patent Document 1, an IGBT has been proposed in which the turn-on loss also can be reduced by dividing the gate electrode into three, and by driving the three gate electrodes only at turn-on.

DETAILED DESCRIPTION

Figure 1:
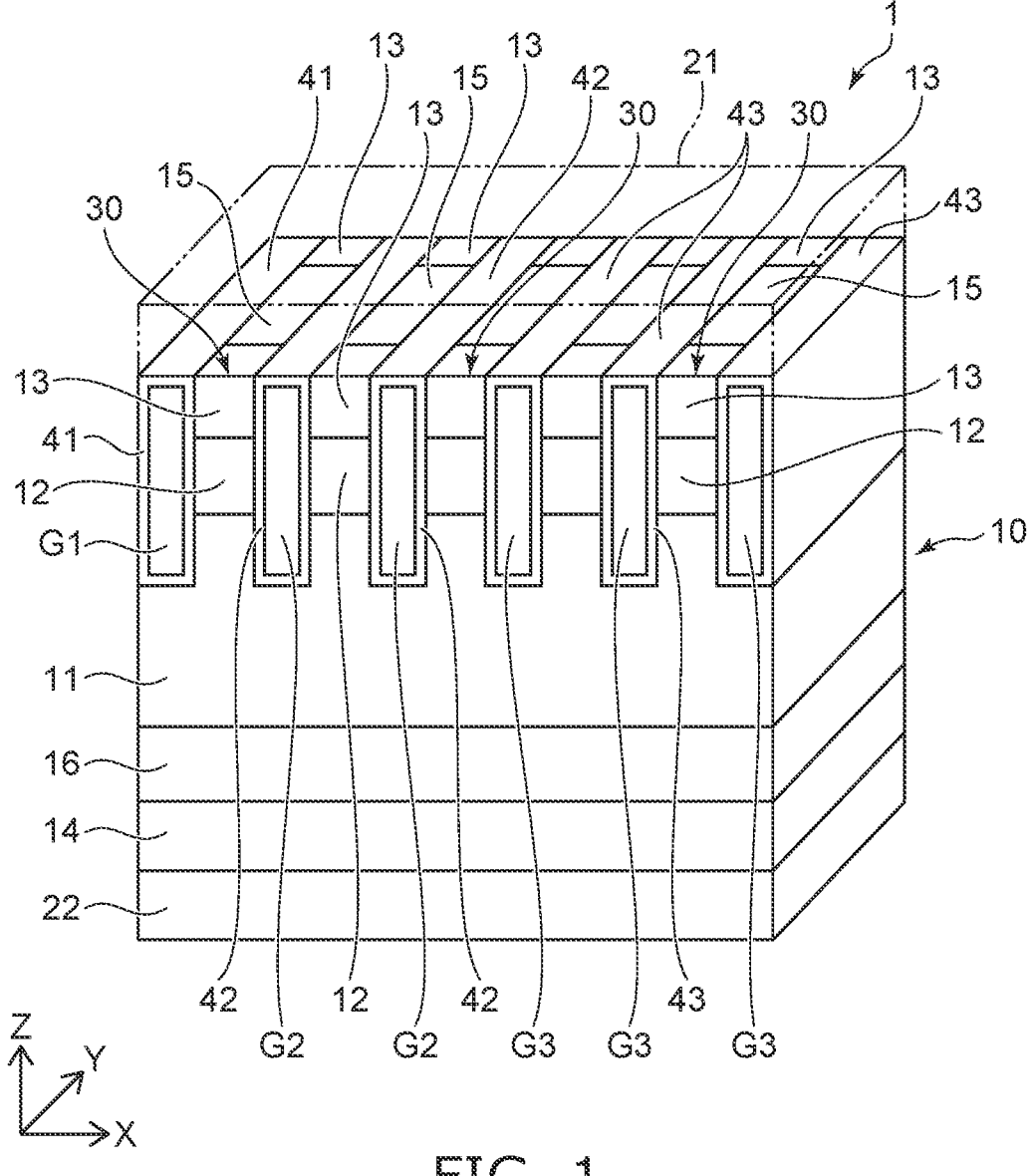
FIG. 1 is a cross-sectional perspective view of a semiconductor device of a first embodiment.

According to one embodiment, a semiconductor device includes a first electrode; a second electrode; a semiconductor part located between the first electrode and the second electrode, the semiconductor part including a first semiconductor layer of a first conductivity type, a second semiconductor layer of a second conductivity type, a third semiconductor layer of the first conductivity type, and a fourth semiconductor layer of the second conductivity type; first to third gate electrodes located between the semiconductor part and the first electrode, the first to third gate electrodes facing the first to third semiconductor layers and being electrically isolated from each other; a first insulating film located between the first gate electrode and the semiconductor part; a second insulating film located between the second gate electrode and the semiconductor part; and a third insulating film located between the third gate electrode and the semiconductor part. The second semiconductor layer is located between the first semiconductor layer and the third semiconductor layer. The third semiconductor layer is located between the second semiconductor layer and the first electrode and electrically connected to the first electrode. The fourth semiconductor layer is located between the first semiconductor layer and the second electrode and electrically connected to the second electrode. S1≤S2<S3 being satisfied, where S1 is a surface area of the first gate electrode and the third semiconductor layer facing each other via the first insulating film, S2 is a surface area of the second gate electrode and the third semiconductor layer facing each other via the second insulating film, and S3 is a surface area of the third gate electrode and the third semiconductor layer facing each other via the third insulating film.

Embodiments will now be described with reference to the drawings. The same components in the drawings are marked with the same reference numerals.

First Embodiment

FIG. 1 is a cross-sectional perspective view of a semiconductor device 1 of a first embodiment. The semiconductor device 1 includes, for example, an IGBT.

The semiconductor device 1 includes a first electrode 21, a second electrode 22, a semiconductor part 10, a first gate electrode G1, a second gate electrode G2, a third gate electrode G3, a first insulating film 41, a second insulating film 42, and a third insulating film 43. In FIG. 1, the first electrode 21 is illustrated by a double dot-dash line to clearly show the surface of the semiconductor part 10 covered with the first electrode 21.

The first electrode 21 and the second electrode 22 are separated in a first direction Z. Two directions orthogonal to the first direction Z in FIG. 1 are taken as a second direction X and a third direction Y. The second direction X and the third direction Y are orthogonal to each other. The first electrode 21 is, for example, an emitter electrode of the IGBT. The second electrode 22 is, for example, a collector electrode of the IGBT.

The semiconductor part 10 is located between the first electrode 21 and the second electrode 22 in the first direction Z. The material of the semiconductor part 10 is, for example, silicon. For example, silicon carbide or gallium nitride also can be used as the material of the semiconductor part 10.

The semiconductor part 10 includes a first semiconductor layer 11 of a first conductivity type, a second semiconductor layer 12 of a second conductivity type, a third semiconductor layer 13 of the first conductivity type, and a fourth semiconductor layer 14 of the second conductivity type. According to the embodiment, for example, the first conductivity type is an n-type, and the second conductivity type is a p-type.

The semiconductor part 10 includes multiple mesa parts 30 separated from each other in the second direction X. Each mesa part 30 extends in the third direction Y. Each mesa part 30 includes the third semiconductor layer 13, the second semiconductor layer 12, and a portion of the first semiconductor layer 11.

The first semiconductor layer 11 is, for example, an n-type drift layer of the IGBT. The second semiconductor layer 12 is, for example, a p-type base layer of the IGBT. The second semiconductor layer 12 is located between the first semiconductor layer 11 and the third semiconductor layer 13 in the first direction Z.

The third semiconductor layer 13 is, for example, an n-type emitter layer of the IGBT. The n-type impurity concentration of the third semiconductor layer 13 is greater than the n-type impurity concentration of the first semiconductor layer 11. The third semiconductor layer 13 is located between the second semiconductor layer 12 and the first electrode 21 in the first direction Z and is electrically connected to the first electrode 21.

The fourth semiconductor layer 14 is, for example, a p-type collector layer of the IGBT. The fourth semiconductor layer 14 is located between the second electrode 22 and the first semiconductor layer 11 in the first direction Z and is electrically connected to the second electrode 22.

The semiconductor part 10 can further include a fifth semiconductor layer 15 of the second conductivity type and a sixth semiconductor layer 16 of the first conductivity type.

The fifth semiconductor layer 15 is, for example, a p-type base contact layer of the IGBT. The p-type impurity concentration of the fifth semiconductor layer 15 is greater than the p-type impurity concentration of the second semiconductor layer 12. The fifth semiconductor layer 15 is located between the second semiconductor layer 12 and the first electrode 21 and electrically connected to the first electrode 21. The fifth semiconductor layer 15 is included in the mesa part 30. The third semiconductor layer 13 and the fifth semiconductor layer 15 are alternately arranged in the third direction Y on the second semiconductor layer 12 of the mesa part 30.

The sixth semiconductor layer 16 is, for example, an n-type buffer layer of the IGBT. The n-type impurity concentration of the sixth semiconductor layer 16 is greater than the n-type impurity concentration of the first semiconductor layer 11. The sixth semiconductor layer 16 is located between the fourth semiconductor layer 14 and the first semiconductor layer 11 in the first direction Z.

The first gate electrode G1, the second gate electrode G2, and the third gate electrode G3 are located between the semiconductor part 10 and the first electrode 21 in the first direction Z. The first gate electrode G1, the second gate electrode G2, and the third gate electrode G3 are electrically isolated from each other. For example, polycrystalline silicon can be used as the material of the first to third gate electrodes G1 to G3.

The structure shown in FIG. 1 is multiply repeated in the second direction X. In other words, the multiple first gate electrodes G1, the multiple second gate electrodes G2, and the multiple third gate electrodes G3 are separated from each other in the second direction X. The first gate electrodes G1, the second gate electrodes G2, and the third gate electrodes G3 extend in the third direction Y.

The first insulating film 41 is located between the first gate electrode G1 and the semiconductor part 10. The first gate electrode G1 is next to the mesa part 30 with the first insulating film 41 interposed in the second direction X. The side surface in the second direction X of the first gate electrode G1 faces the first semiconductor layer 11, the second semiconductor layer 12, the third semiconductor layer 13, and the fifth semiconductor layer 15 of the mesa part 30 via the first insulating film 41. The first insulating film 41 is located also between the first electrode 21 and the upper end of the first gate electrode G1.

The second insulating film 42 is located between the second gate electrode G2 and the semiconductor part 10. The second gate electrode G2 is next to the mesa part 30 with the second insulating film 42 interposed in the second direction X. The side surface in the second direction X of the second gate electrode G2 faces the first semiconductor layer 11, the second semiconductor layer 12, the third semiconductor layer 13, and the fifth semiconductor layer 15 of the mesa part 30 via the second insulating film 42. The second insulating film 42 is located also between the first electrode 21 and the upper end of the second gate electrode G2.

The third insulating film 43 is located between the third gate electrode G3 and the semiconductor part 10. The third gate electrode G3 is next to the mesa part 30 with the third insulating film 43 interposed in the second direction X. The side surface in the second direction X of the third gate electrode G3 faces the first semiconductor layer 11, the second semiconductor layer 12, the third semiconductor layer 13, and the fifth semiconductor layer 15 of the mesa part 30 via the third insulating film 43. The third insulating film 43 is located also between the first electrode 21 and the upper end of the third gate electrode G3.

For example, a silicon oxide film or a silicon nitride film can be used as the first to third insulating films 41, 42, and 43.

$S1 \le S2 < S3$ is satisfied, where S1 is the surface area of the first gate electrode G1 and the third semiconductor layer 13 facing each other via the first insulating film 41, S2 is the surface area of the second gate electrode G2 and the third semiconductor layer 13 facing each other via the second insulating film 42, and S3 is the surface area of the third gate electrode G3 and the third semiconductor layer 13 facing each other via the third insulating film 43.

According to the first embodiment, $S1 \le S2 < S3$ is satisfied by setting the number of the third gate electrodes G3 to be greater than the number of the second gate electrodes G2, and by setting the number of the second gate electrodes G2 to be not less than the number of the first gate electrodes G1. The arrangement positions and volume ratios of the third and fifth semiconductor layers 13 and 15 on the second semiconductor layer 12 are the same between the mesa parts 30.

Figures 6A, 6B, 6C:
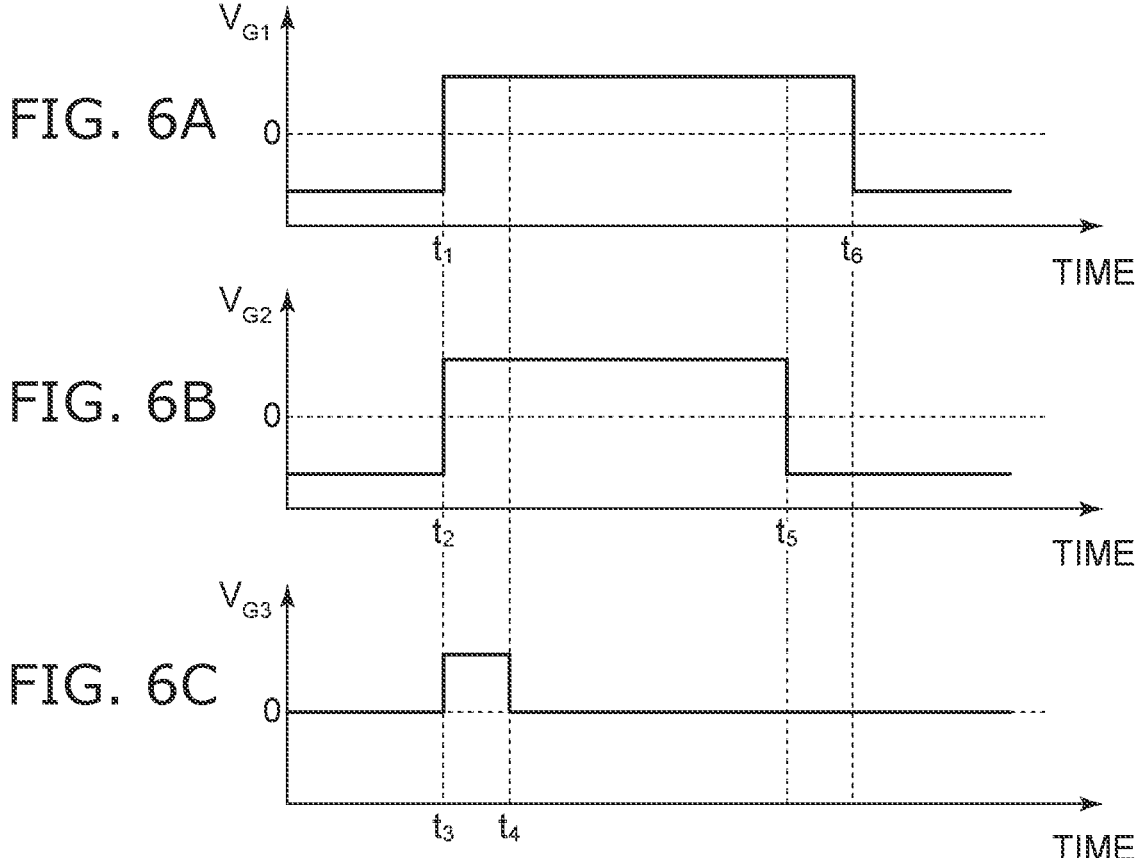
FIGS. 6A to 6C are timing charts showing an example of a method for controlling the semiconductor device of the embodiment.

FIGS. 6A to 6C are timing charts showing an example of a method for controlling the semiconductor device 1. FIG. 6A illustrates a potential (a first control potential) $V_{G1}$ applied to the first gate electrode G1; FIG. 6B illustrates a potential (a second control potential) $V_{G2}$ applied to the second gate electrode G2; and FIG. 6C illustrates a potential (a third control potential) $V_{G3}$ applied to the third gate electrode G3.

The first control potential $V_{G1}$ of the first gate electrode G1, the second control potential $V_{G2}$ of the second gate electrode G2, and the third control potential $V_{G3}$ of the third gate electrode G3 are controlled independently from each other.

When operating the semiconductor device 1, for example, the potential of the first electrode 21 is maintained at a lower potential than the second electrode 22. The semiconductor device 1 is turned on at a first timing t1 and turned off at a sixth timing t6.

At the first timing t1, the first control potential $V_{G1}$ that is applied to the first gate electrode G1 is set to be greater than a first threshold voltage of the first gate electrode G1. Thereby, a first channel (an n-type inversion layer) is induced in the region of the second semiconductor layer 12 facing the first gate electrode G1. Electrons are injected from the first electrode 21 into the first semiconductor layer 11 via the third semiconductor layer 13 and the first channel. Correspondingly, holes are injected from the fourth semiconductor layer 14 into the first semiconductor layer 11 via the sixth semiconductor layer 16.

At a second timing t2, the second control potential $V_{G2}$ that is applied to the second gate electrode G2 is set to be greater than the second threshold voltage of the second gate electrode G2. Thereby, a second channel (an n-type inversion layer) is induced in the region of the second semiconductor layer 12 facing the second gate electrode G2. Electrons are injected from the first electrode 21 into the first semiconductor layer 11 via the third semiconductor layer 13 and the second channel. Correspondingly, holes are injected from the fourth semiconductor layer 14 into the first semiconductor layer 11 via the sixth semiconductor layer 16.

At a third timing t3, the third control potential $V_{G3}$ that is applied to the third gate electrode G3 is set to be greater than the third threshold voltage of the third gate electrode G3. Thereby, a third channel (an n-type inversion layer) is induced in the region of the second semiconductor layer 12 facing the third gate electrode G3. Electrons are injected from the first electrode 21 into the first semiconductor layer 11 via the third semiconductor layer 13 and the third channel. Correspondingly, holes are injected from the fourth semiconductor layer 14 into the first semiconductor layer 11 via the sixth semiconductor layer 16.

For example, the first timing t1, the second timing t2, and the third timing t3 are simultaneous. The first timing t1, the second timing t2, and the third timing t3 may be different from each other. It is favorable for the first gate electrode G1, the second gate electrode G2, and the third gate electrode G3 to be simultaneously turned onto reduce the turn-on loss of the semiconductor device 1.

The third control potential $V_{G3}$ is set to be less than the third threshold voltage at a fourth timing t4 that is after the first to third timing t1, t2, and t3. Thereby, the third channel in the region of the second semiconductor layer 12 facing the third gate electrode G3 disappears.

At a fifth timing t5 that is after the fourth timing t4, the second control potential $V_{G2}$ is set to be less than the second threshold voltage. Thereby, the second channel in the region of the second semiconductor layer 12 facing the second gate electrode G2 disappears.

At the sixth timing t6 that is after the fifth timing t5, the first control potential $V_{G1}$ is set to be less than the first threshold voltage. Thereby, the first channel in the region of the second semiconductor layer 12 facing the first gate electrode G1 disappears.

The period between the second timing t2 and the fifth timing t5 is greater than the period between the fifth timing t5 and the sixth timing t6. The period between the fourth timing t4 and the fifth timing t5 is greater than the period between the fifth timing t5 and the sixth timing t6.

The semiconductor device 1 is switched on and off by the first gate electrode G1. When turning off the semiconductor device 1, the second gate electrode G2 is switched off before the first gate electrode G1. The third gate electrode G3 is switched on only at turn-on of the semiconductor device 1 and for only a short period of time.

According to the embodiment as described above, the surface areas of the gate electrodes G1, G2, and G3 facing the third semiconductor layer 13 have the relationship of S1≤S2<S3. Thereby, the electron injection amount into the first semiconductor layer 11 at turn-on can be increased in a short period of time, and the turn-on loss can be reduced. A low saturation current can be maintained and the short-circuit withstand capacity can be ensured by switching the third gate electrode G3 off (causing the third channel to disappear) during the on period. Also, the electron injection amount into the first semiconductor layer 11 can be narrowed down and the turn-off loss can be reduced by turning off the second gate electrode G2 before the first gate electrode G1. Accordingly, according to the first embodiment, the switching losses at turn-on and turn-off of the semiconductor device 1 can be reduced.

Second Embodiment

Figure 2:
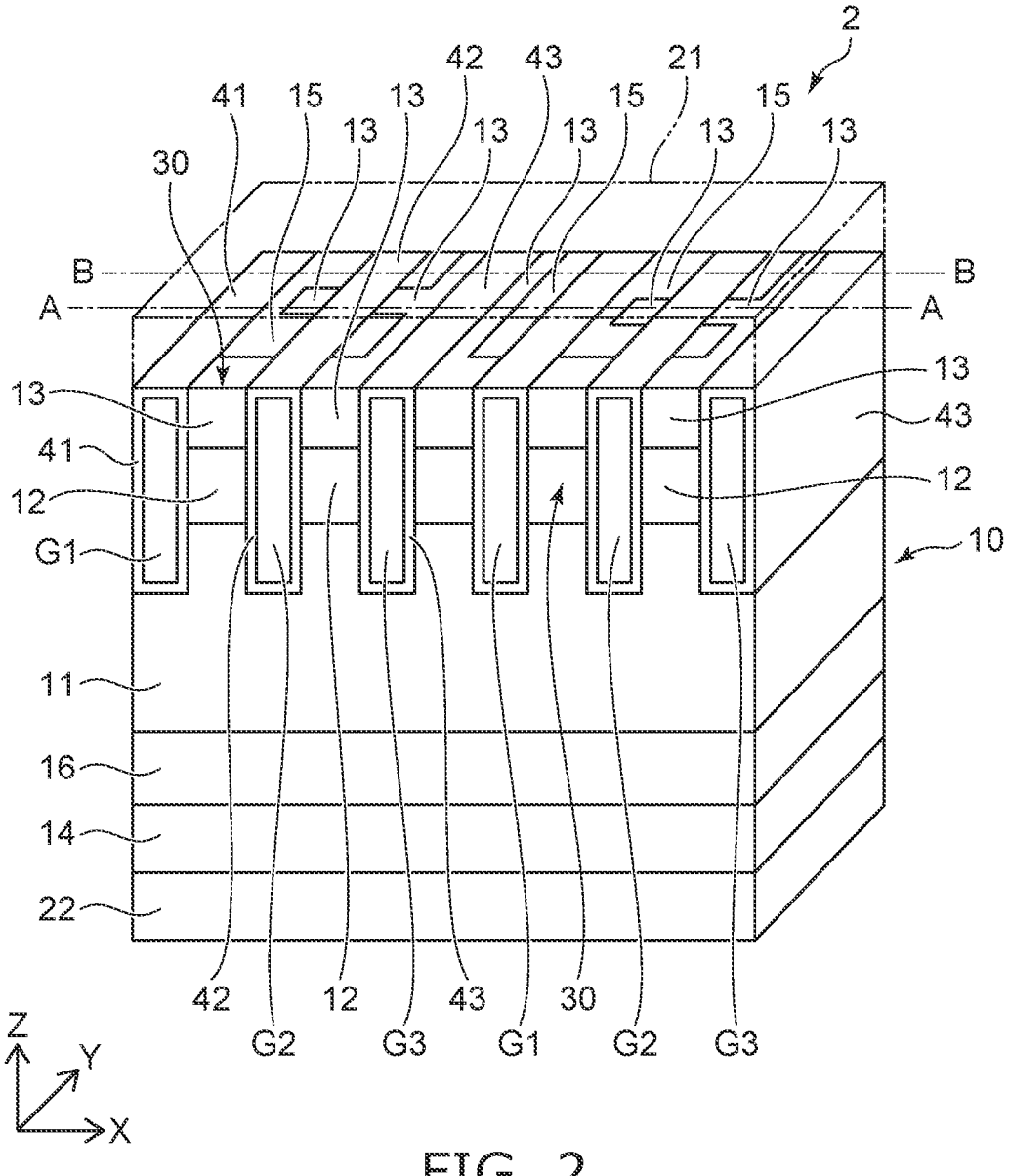
FIG. 2 is a cross-sectional perspective view of a semiconductor device of a second embodiment.
Figure 3:
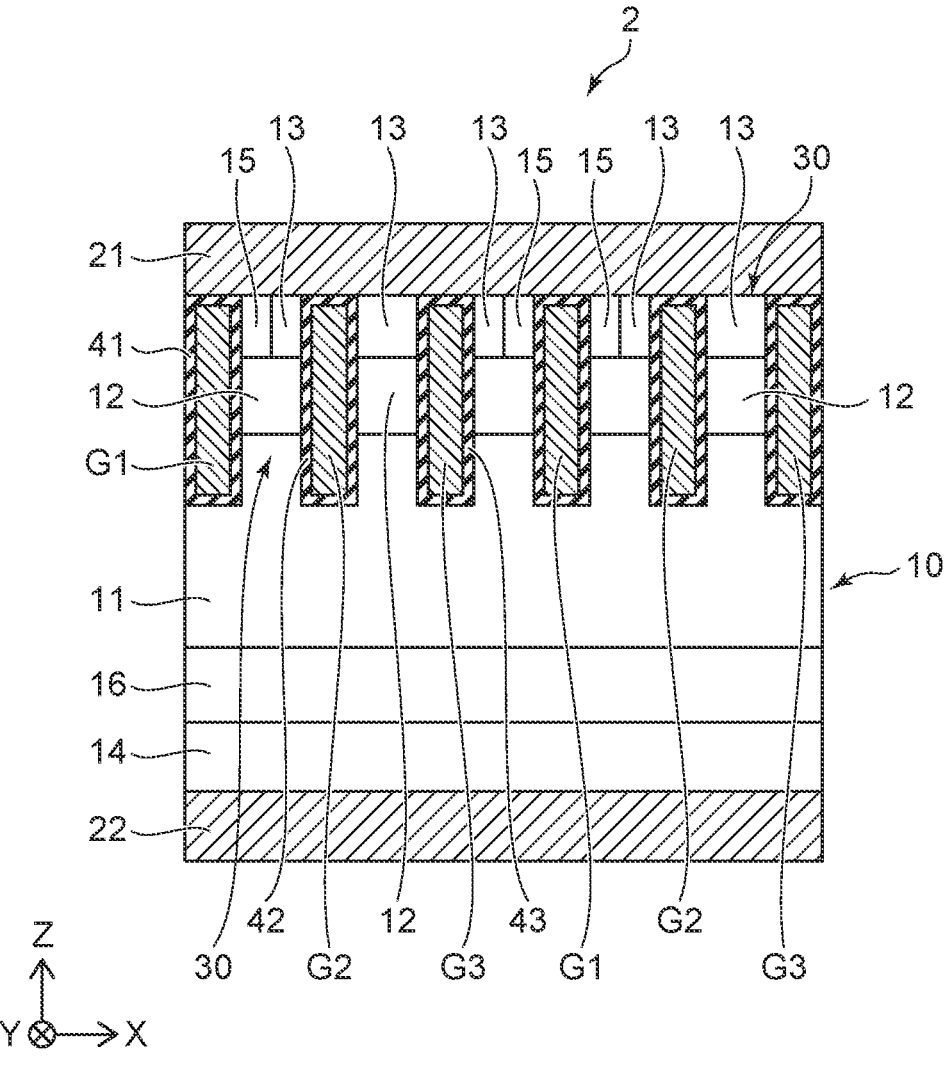
FIG. 3 is an A-A cross-sectional view of FIG. 2.
Figure 4:
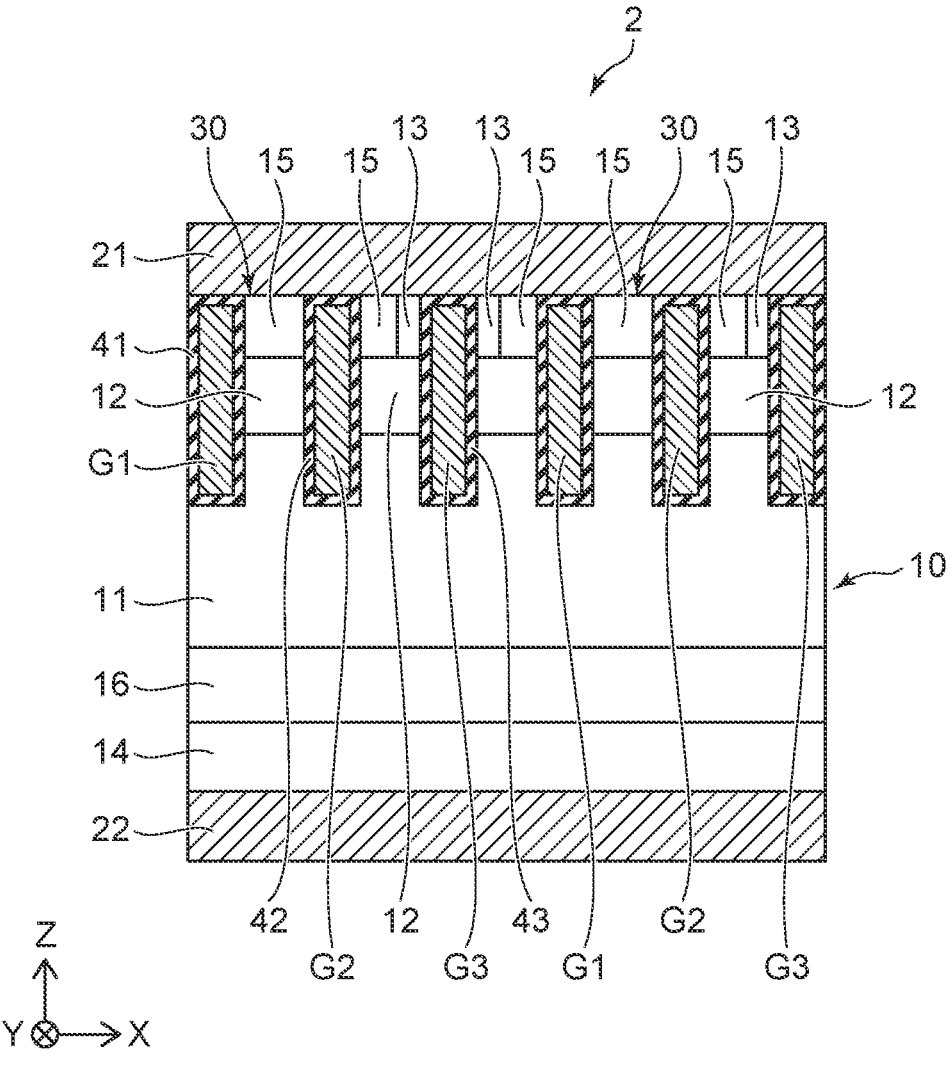
FIG. 4 is a B-B cross-sectional view of FIG. 2.

FIG. 2 is a cross-sectional perspective view of a semiconductor device 2 of a second embodiment. FIG. 3 is an A-A cross-sectional view of FIG. 2. FIG. 4 is a B-B cross-sectional view of FIG. 2.

According to the second embodiment, the surface area of the third semiconductor layer 13 facing the first gate electrode G1 via the first insulating film 41, the surface area of the third semiconductor layer 13 facing the second gate electrode G2 via the second insulating film 42, and the surface area of the third semiconductor layer 13 facing the third gate electrode G3 via the third insulating film 43 are different by setting different volume ratios of the third semiconductor layers 13 between the mesa parts 30. The volume ratios of the third semiconductor layers 13 are different between the mesa parts 30 that are next to each other in the second direction X. S1≤S2<S3 is satisfied thereby, where S1 is the surface area of the first gate electrode G1 and the third semiconductor layer 13 facing each other via the first insulating film 41, S2 is the surface area of the second gate electrode G2 and the third semiconductor layer 13 facing each other via the second insulating film 42, and S3 is the surface area of the third gate electrode G3 and the third semiconductor layer 13 facing each other via the third insulating film 43. The number of the first gate electrodes G1, the number of the second gate electrodes G2, and the number of the third gate electrodes G3 may be equal or different from each other.

According to the second embodiment as well, similarly to the first embodiment, the turn-on loss can be reduced by controlling the first to third gate electrodes G1 to G3 to increase the electron injection amount into the first semiconductor layer 11 in a short period of time at turn-on. A low saturation current can be maintained and the short-circuit withstand capacity can be ensured by switching the third gate electrode G3 off during the on period. By turning off the second gate electrode G2 before the first gate electrode G1, the electron injection amount into the first semiconductor layer 11 can be narrowed down, and the turn-off loss can be reduced. According to the second embodiment as well, the switching losses at turn-on and turn-off of the semiconductor device 2 can be reduced.

Third Embodiment

Figure 5:
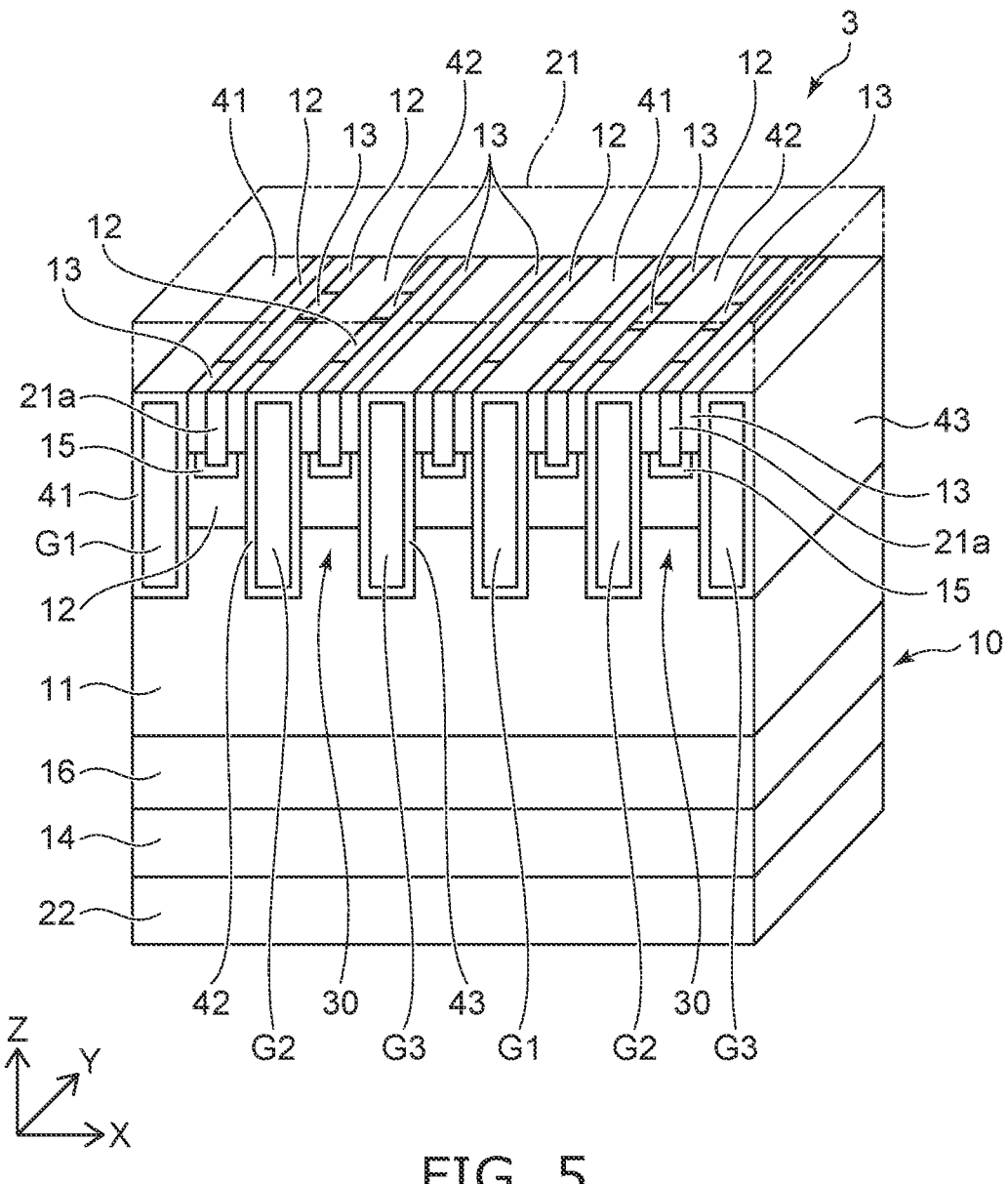
FIG. 5 is a cross-sectional perspective view of a semiconductor device of a third embodiment.

FIG. 5 is a cross-sectional perspective view of a semiconductor device 3 of a third embodiment.

According to the third embodiment as well, similarly to the second embodiment, S1≤S2<S3 is satisfied by setting the surface area of the third semiconductor layer 13 facing the first gate electrode G1 via the first insulating film 41, the surface area of the third semiconductor layer 13 facing the second gate electrode G2 via the second insulating film 42, and the surface area of the third semiconductor layer 13 facing the third gate electrode G3 via the third insulating film 43 to be different. The switching losses at turn-on and turn-off of the semiconductor device 3 can be reduced thereby.

The fifth semiconductor layer 15 is not located at the upper surface of the mesa part 30, but is positioned at the vicinity of the interface at which the second semiconductor layer 12 and the third semiconductor layer 13 contact in the first direction Z. The first electrode 21 includes a trench contact part 21a. The trench contact part 21a extends through the third semiconductor layer 13 in the first direction Z and contacts the fifth semiconductor layer 15. The trench contact part 21a increases the contact area between the first electrode 21 and the third semiconductor layer 13 and reduces the contact resistance between the first electrode 21 and the third semiconductor layer 13.

For example, the n-type third semiconductor layer 13 can be formed by implanting an n-type impurity into the p-type second semiconductor layer 12 in the upper portion of the mesa part 30 and by subsequently causing thermal diffusion. The trench contact part 21a divides the upper portion of the mesa part 30 in the second direction X when thermally diffusing the implanted n-type impurity. Therefore, in the mesa part 30 between the first gate electrode G1 and the second gate electrode G2, the n-type impurity that is implanted into the region facing the second gate electrode G2 can be shielded by the trench contact part 21a and prevented from diffusing to the region facing the first gate electrode G1. Also, in the mesa part 30 between the second gate electrode G2 and the third gate electrode G3, the n-type impurity that is implanted in the region facing the third gate electrode G3 can be shielded by the trench contact part 21a and prevented from diffusing to the region facing the second gate electrode G2. In the mesa part 30 between the third gate electrode G3 and the first gate electrode G1, the n-type impurity that is implanted in the region facing the third gate electrode G3 can be shielded by the trench contact part 21a and prevented from diffusing to the region facing the first gate electrode G1. In other words, the trench contact part 21a makes it easier to control the volume ratio of the third semiconductor layer 13 in each mesa part 30.

In the semiconductor device 1 of the first embodiment as well, a configuration can be used in which the fifth semiconductor layer 15 is located at the vicinity of the interface at which the second semiconductor layer 12 and the third semiconductor layer 13 contact in the first direction Z, and the first electrode 21 includes the trench contact part 21a that reaches the fifth semiconductor layer 15.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a first electrode;
a second electrode;
a semiconductor part located between the first electrode and the second electrode, the semiconductor part including
a first semiconductor layer of a first conductivity type,
a second semiconductor layer of a second conductivity type,
a third semiconductor layer of the first conductivity type,
a fourth semiconductor layer of the second conductivity type, and
a fifth semiconductor layer of the second conductivity type;
a group of gate electrodes located between the semiconductor part and the first electrode, the group of gate electrodes including one or more first gate electrodes, one or more second gate electrodes, and one or more third gate electrodes, each of the first to third gate electrodes in the group facing the first to third semiconductor layers and the first to third gate electrodes in the group being electrically isolated from each other;
a first insulating film located between each of the one or more first gate electrodes and the semiconductor part;
a second insulating film located between each of the one or more second gate electrodes and the semiconductor part; and
a third insulating film located between each of the one or more third gate electrodes and the semiconductor part,
the second semiconductor layer being located between the first semiconductor layer and the third semiconductor layer,
the third semiconductor layer being located between the second semiconductor layer and the first electrode and electrically connected to the first electrode,
the fourth semiconductor layer being located between the first semiconductor layer and the second electrode and electrically connected to the second electrode,
the fifth semiconductor layer being located between the second semiconductor layer and the first electrode and electrically connected to the first electrode, the fifth semiconductor layer having a higher second-conductivity-type impurity concentration than the second semiconductor layer,
the third semiconductor layer and the fifth semiconductor layer being alternately arranged in a direction in which the first to third gate electrodes extend,
$S1 \leq S2 < S3$ being satisfied, where S1 is a total surface area of the one or more first gate electrodes and the third semiconductor layer facing each other via the first insulating film, S2 is a total surface area of the one or more second gate electrodes and the third semiconductor layer facing each other via the second insulating film, and S3 is a total surface area of the one or more third gate electrodes and the third semiconductor layer facing each other via the third insulating film.

2. The device according to claim 1, wherein
a number of the one or more third gate electrodes is greater than a number of the one or more second gate electrodes, and
the number of the one or more second gate electrodes is not less than a number of the one or more first gate electrodes.

3. The device according to claim 1, wherein
the first electrode includes a trench contact part extending through the third semiconductor layer and contacting the fifth semiconductor layer.

4. The device according to claim 1, wherein
the semiconductor part further includes a sixth semiconductor layer of the first conductivity type,
the sixth semiconductor layer is located between the fourth semiconductor layer and the first semiconductor layer, and
the sixth semiconductor layer has a higher first-conductivity-type impurity concentration than the first semiconductor layer.

5. The device according to claim 1, wherein
the first electrode and the second electrode are separated from each other in a first direction,
the semiconductor part includes a plurality of mesa parts separated from each other in a second direction orthogonal to the first direction, each of the mesa parts extends in a third direction and includes the third semiconductor layer, the second semiconductor layer, and a portion of the first semiconductor layer, and the third direction is orthogonal to the first and second directions.

6. The device according to claim 5, wherein volume ratios of the third semiconductor layers are different between the mesa parts next to each other in the second direction.

7. The device according to claim 5, wherein the mesa part further includes the fifth semiconductor layer of the second conductivity type, and the third semiconductor layer and the fifth semiconductor layer are alternately arranged in the third direction.

8. The device according to claim 1, wherein a potential of the first gate electrode, a potential of the second gate electrode, and a potential of the third gate electrode are controlled independently from each other.

9. The device according to claim 8, wherein a first control potential applied to the first gate electrode at a first timing is greater than a first threshold voltage of the first gate electrode, a second control potential applied to the second gate electrode at a second timing is greater than a second threshold voltage of the second gate electrode, a third control potential applied to the third gate electrode at a third timing is greater than a third threshold voltage of the third gate electrode, the third control potential is set to be less than the third threshold voltage at a fourth timing after the first to third timings, the second control potential is set to be less than the second threshold voltage at a fifth timing after the fourth timing, and the first control potential is set to be less than the first threshold voltage at a sixth timing after the fifth timing.

10. The device according to claim 9, wherein the first timing, the second timing, and the third timing are simultaneous.

11. The device according to claim 9, wherein a period between the second timing and the fifth timing is greater than a period between the fifth timing and the sixth timing.

12. The device according to claim 9, wherein a period between the fourth timing and the fifth timing is greater than a period between the fifth timing and the sixth timing.

13. The device according to claim 1, comprising:

an IGBT (Insulated Gate Bipolar Transistor).

14. The device according to claim 1, wherein the first conductivity type is an n-type, and the second conductivity type is a p-type.

* * * * *